United States Patent
Wu et al.

(10) Patent No.: US 9,721,949 B1
(45) Date of Patent: Aug. 1, 2017

(54) METHOD OF FORMING SUPER STEEP RETROGRADE WELLS ON FINFET

(71) Applicant: GLOBALFOUNDRIES Inc., Grand Cayman (KY)

(72) Inventors: Xusheng Wu, Ballston Lake, NY (US); Qizhi Liu, Lexington, MA (US); David Harame, Essex Junction, VT (US); Renata Camillo-Castillo, Williston, VT (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 15/010,189

(22) Filed: Jan. 29, 2016

(51) Int. Cl.
- H01L 27/088 (2006.01)
- H01L 21/8234 (2006.01)
- H01L 21/02 (2006.01)
- H01L 21/324 (2006.01)
- H01L 21/308 (2006.01)
- H01L 21/311 (2006.01)

(52) U.S. Cl.
CPC ...... H01L 27/0886 (2013.01); H01L 21/0217 (2013.01); H01L 21/02164 (2013.01); H01L 21/02271 (2013.01); H01L 21/308 (2013.01); H01L 21/31144 (2013.01); H01L 21/324 (2013.01); H01L 21/823431 (2013.01)

(58) Field of Classification Search
CPC ......... H01L 21/02129; H01L 21/31625; H01L 21/823431; H01L 27/0886; H01L 21/02271; H01L 21/31144; H01L 21/02164; H01L 21/308; H01L 21/0217
See application file for complete search history.

(56) References Cited

U.S. PATENT DOCUMENTS

| | | | |
|---|---|---|---|
| 9,385,189 B1 * | 7/2016 | Sung | H01L 29/0638 |
| 2016/0056156 A1 * | 2/2016 | Ghani | H01L 21/823821 257/401 |
| 2016/0211262 A1 * | 7/2016 | Jan | H01L 21/823821 |
| 2016/0329253 A1 * | 11/2016 | Liu | H01L 21/823821 |

OTHER PUBLICATIONS

F. Sarubbi et al., "High Effective Gummel Number of CVD Boron Layers in Ultrashallow p+n Diode Configurations", IEEE Transactions on Electron Devices, vol. 57, No. 6, Jun. 2010.
V. Mohammadi, et al., "Pattern Dependency and Loading Effect of Pure-Boron-Layer Chemical-Vapor Deposition", ECS Journal of Solid State Science and Technology Q16-Q20 (2012).

* cited by examiner

Primary Examiner — Thanh Y Tran
(74) Attorney, Agent, or Firm — Heslin Rothenberg Farley & Mesiti P.C.

(57) ABSTRACT

A method of making a semiconductor structure is provided including providing a plurality of fins on a semiconductor substrate; depositing a layer containing silicon dioxide on the plurality of fins and on a surface of the semiconductor substrate; depositing a photoresist layer on one or more but less than all of the plurality of fins; etching the layer of silicon dioxide off of one or more of the plurality of fins on which the photoresist layer had not been deposited; stripping the photoresist layer; depositing a layer of pure boron on one or more of the plurality of fins on which a photoresist had not been deposited; and depositing a silicon nitride liner step on the plurality of fins. A partial semiconductor device fabricated by said method is also provided.

13 Claims, 4 Drawing Sheets

US 9,721,949 B1

METHOD OF FORMING SUPER STEEP RETROGRADE WELLS ON FINFET

FIELD OF THE INVENTION

The present invention relates to semiconductor devices and methods of fabricating semiconductor devices, and more particularly, to methods and devices for forming super steep retrograde wells in FinFETs.

BACKGROUND OF THE INVENTION

Semiconductor structures, such as, integrated circuits are formed from semiconductor substrates within and upon whose surfaces may be formed electrical circuit elements such as transistors including field-effect transistors (FETs). Conventionally, field-effect transistors have been fabricated as planar circuit elements.

Fin field-effect transistor (FinFET) devices are currently being developed to replace conventional planar transistors, such as metal oxide semiconductor field-effect transistors (MOSFETs), in advanced complementary metal oxide semiconductor (CMOS) technology, due to their improved short channel effect immunity and higher on-current to off-current ratio ($I_{on}/I_{off}$). As is known, the term "fin" refers to a vertical structure within or upon which are formed, for instance, one or more FinFETs or other fin devices, such as passive devices, including capacitors, diodes etc.

As described by Moore's Law, the semiconductor industry drives down pattern dimensions in order to reduce transistor size and enhance processor speed at a rapid pace. Further enhancements in fin device structures and fabrication methods therefor continue to be pursued for enhanced performance and commercial advantage. As the size of transistors, and components such as fin width and pitch, are reduced, obstacles pertaining to punchthrough of current may be encountered, hampering attempts to further reduce scale. The use of super steep retrograde wells (SSRW) in transistor design may ameliorate these difficulties, but conventional methodologies for forming SSRW preclude adopting fin widths and pitches below a certain minimum. Thus, an improved method for forming SSWR is needed.

SUMMARY OF THE INVENTION

The shortcomings of the prior art are overcome and additional advantages are provided through the provision, in one aspect, of a method of making a semiconductor structure including providing a plurality of fins on a semiconductor substrate; depositing a layer including silicon dioxide on the plurality of fins and on a surface of the semiconductor substrate; depositing a photoresist layer on one or more but less than all of the plurality of fins; etching the layer of silicon dioxide off of one or more of the plurality of fins on which the photoresist layer had not been deposited; stripping the photoresist layer; depositing a layer of pure boron on one or more of the plurality of fins on which a photoresist had not been deposited; and depositing a silicon nitride liner step on the plurality of fins.

In another aspect, the method includes depositing a layer of sacrificial oxide on the silicon nitride liner; recessing a portion of the layer of sacrificial oxide to expose a tip of the plurality of fins wherein the portion is less than all; removing the silicon nitride liner from the tip of the plurality of fins; removing a portion of the layer of phosphosilicate glass without removing a remainder of the layer of phosphosilicate glass and removing a portion of the layer of pure boron and without removing a remainder of the layer of pure boron, wherein the portion of the layer of phosphosilicate glass and the portion of the layer of pure boron are on the tip of the plurality of fins; and annealing the remainder of the layer of phosphosilicate glass and the remainder of the layer of pure boron to form a plurality of doped wells in the semiconductor substrate.

In another aspect, a partial semiconductor structure is provided, including a plurality of fins with sidewalls; a layer of pure boron on one or more of a first plurality of sidewalls; a first silicon nitride liner on the layer of pure boron; and a layer of oxide between the plurality of fins. In another aspect, the partial semiconductor substrate includes a layer of phosphosilicate glass on one or more of a second plurality of sidewalls; and a silicon nitride liner on the layer of phosphosilicate glass.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
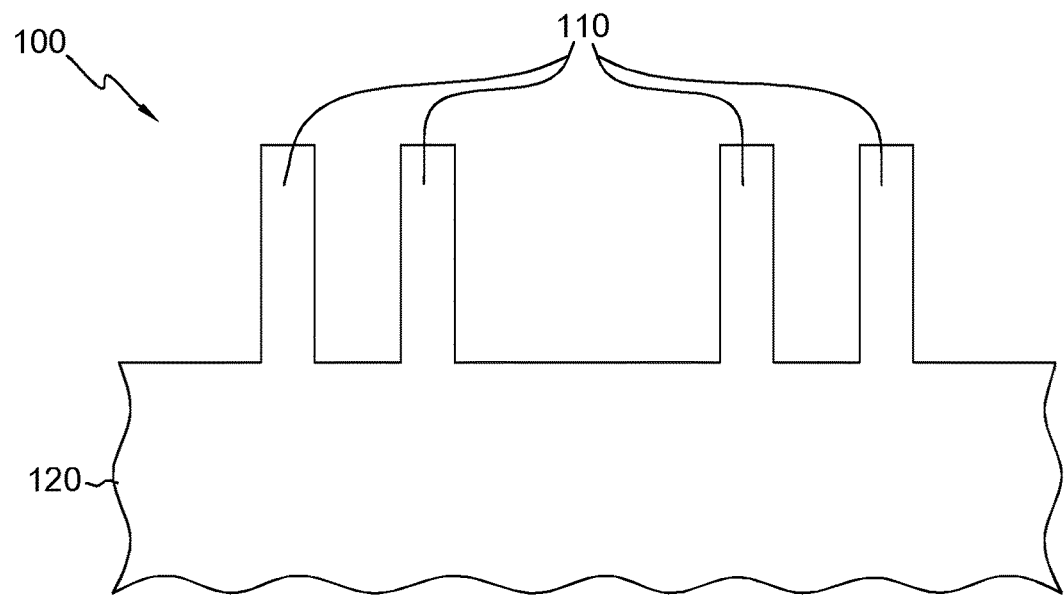
FIG. 1 depicts a partial semiconductor substrate in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers may be used throughout different figures to designate the same or similar components.

Generally stated, disclosed herein is a method for forming super steep retrograde wells for n-doped and p-doped FinFETs. With progressively smaller dimensions of transistors, limitations arise that prevent optimal functioning. One difficulty is punchthrough, which results when depletion regions around the source and drain of a transistor merge by coming into contact with each other, which increases current leakage and drain and may short the channel. One solution is creating a super steep retrograde well (SSRW) to prevent merging of depletion regions. But the fabrication steps required for SSRW formation may themselves pose complications and further limitations on progressively reducing transistor scale.

Conventionally, SSRW are formed by depositing a thin layer of materials containing dopant on fins in a semiconductor device, followed by an annealing process to drive dopant into the substrate. For an NFET, a dopant such as boron may be deposited. Conventionally, boron-doped silicon dioxide in the form of borosilicate glass may be deposited, such as by chemical vapor deposition or other another appropriate method. For a PFET, a dopant source such as phosphosilicate glass may be used. After a dopant source is deposited, additional layers may be required, including a high quality oxide layer and cap layers such as silicon nitride cap. Minimum thicknesses of such layers may be on the order of 3 nm. This accumulating thickness of successive layers may ultimately occlude the space between fins. This may be particularly so for NFET SSRW because, during conventional fabrication, duplicative layers may need to be deposited during the formation of NFET SSRW.

For example, where NFET and PFET SSRW are both being fabricated on different fins of a semiconductor structure, depending on the order in which dopant-source layers are deposited before annealing, multiple cap layers may accumulate on NFET fins. For example, such fins may have a silicon nitride cap layer deposited on a boron-doped layer. During subsequent processing, a PFET dopant layer may be deposited elsewhere, followed by conformal deposition of a nitride cap layer on the PFET dopant layer which is also deposited on NFET fins, resulting in multiple nitride cap layers on NFET fins. Fabrication methods such as this that require deposition of functionally inconsequential layers undesirably limits the close spacing of fins that may otherwise permit further reductions of scale. For example, if adjacent NFET fins require conformal deposition of a boron-doped layer and nitride cap layer, a high quality oxide layer, and another nitride cap layer secondary to depositing a nitride cap layer on a dopant layer on PFET fins, there is a limit to how closely the NFET fins can be spaced before the space between them will be pinched off, leaving no room for, for example, depositing shallow trench isolation material therebetween, or creating gap fill complications even if the space is not completely pinched off.

The present invention eliminates the deposition of a functionally inconsequential nitride cap layer on NFET fins with a pre-anneal dopant-source layer for SSRW formation. A thin layer of pure boron may be conformally deposited as a dopant source for NFET SSRW, rather than boron-doped silicon dioxide, borosilicate glass, or other dopant sources. Moreover, pure boron may be selectively deposited on a silicon-based substrate and fins, without being deposited on areas where phosphate doped silicon dioxide, or where phosphosilicate glass, has been deposited as a dopant-source for PFET SSRW. This selective boron deposition, which may be done by chemical vapor deposition, allows for deposition of fewer, thinner layers during pre-anneal SSRW formation, in fewer overall steps, relative to conventional methods, facilitating processing, permitting a narrower pitch between fins and ameliorating complications due to gap fill problems for shallow trench isolation.

Figure 2:
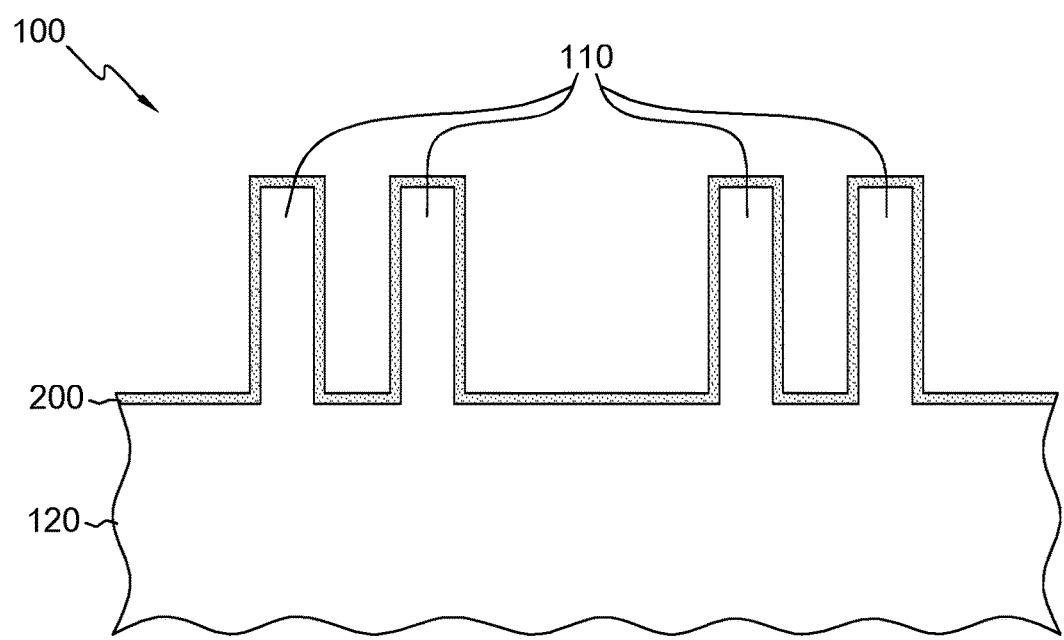
FIG. 2 depicts the partial semiconductor substrate of FIG. 1 after layer of silicon dioxide has been deposited thereupon.

FIG. 1 shows a partial semiconductor structure 100 in which fins 110 have been defined on semiconductor substrate 120. Referring to FIG. 2, PFET SSRW dopant-source layer 200 is conformally deposited over the fins 110 and partial semiconductor substrate 100. In this example, PFET SSRW dopant-source layer 200 is deposited by chemical vapor deposition, and may be approximately 3 nm in thickness. Although PFET SSRW dopant-source layer 200 is conformally deposited over the fins 110, only some fins in this example are intended to have PFET SSRW. Patterning is required to remove PFET SSRW dopant-source layer 200 from fins that are not intended to have PFET SSRW.

Figure 3:
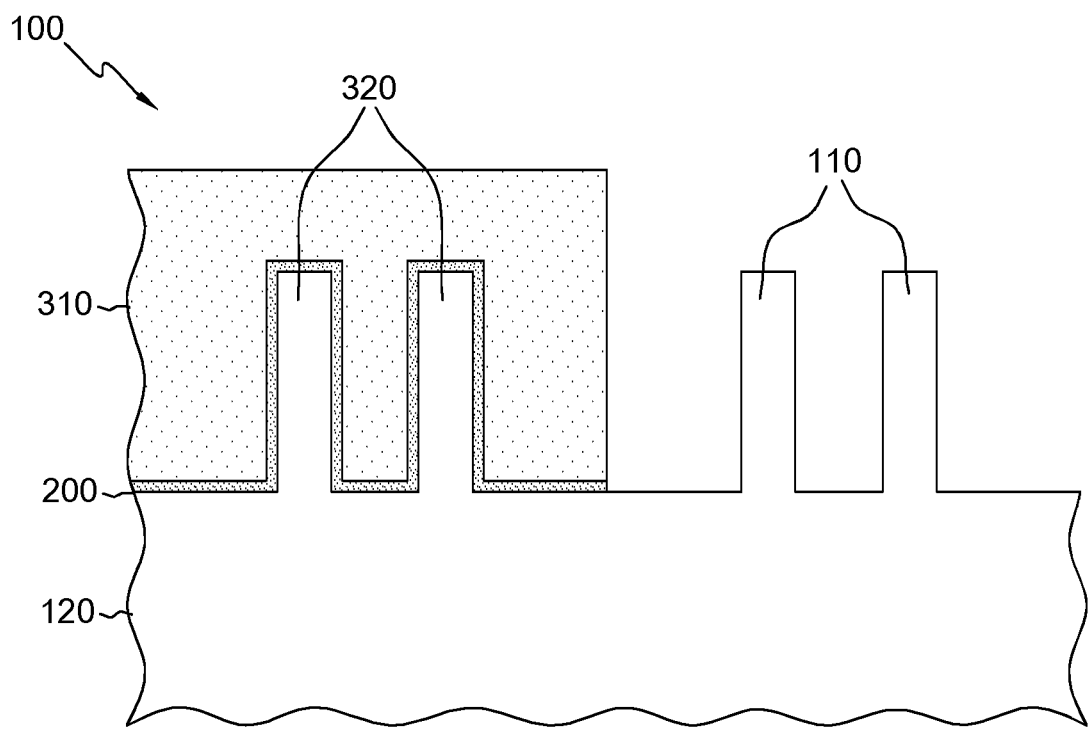
FIG. 3 depicts the partial semiconductor substrate of FIG. 2 after a lithographic patterning and etching of regions of the silicon.

FIG. 3 shows partial semiconductor substrate 100 after patterning regions for PFET SSRW formation. A lithographic process may be used to pattern intended PFET SSRW regions. In FIG. 3, resist layer 310 is shown, having been lithographically patterned over PFET SSRW fins 320, and nearby surface of substrate 120. No resist is present over fins 110. Subsequent to patterning resist 310, PFET SSRW dopant-source layer 200 was etched from fins 110 and adjacent surfaces of substrate 120 not protected by resist 310. Any etching process and etchant may be used for removing PFET SSRW dopant-source layer 200, such as a buffered hydrofluoric acid wet etch process to remove a silicon dioxide layer containing phosphorous as the PFET SSRW dopant-source layer 200.

Figure 4:
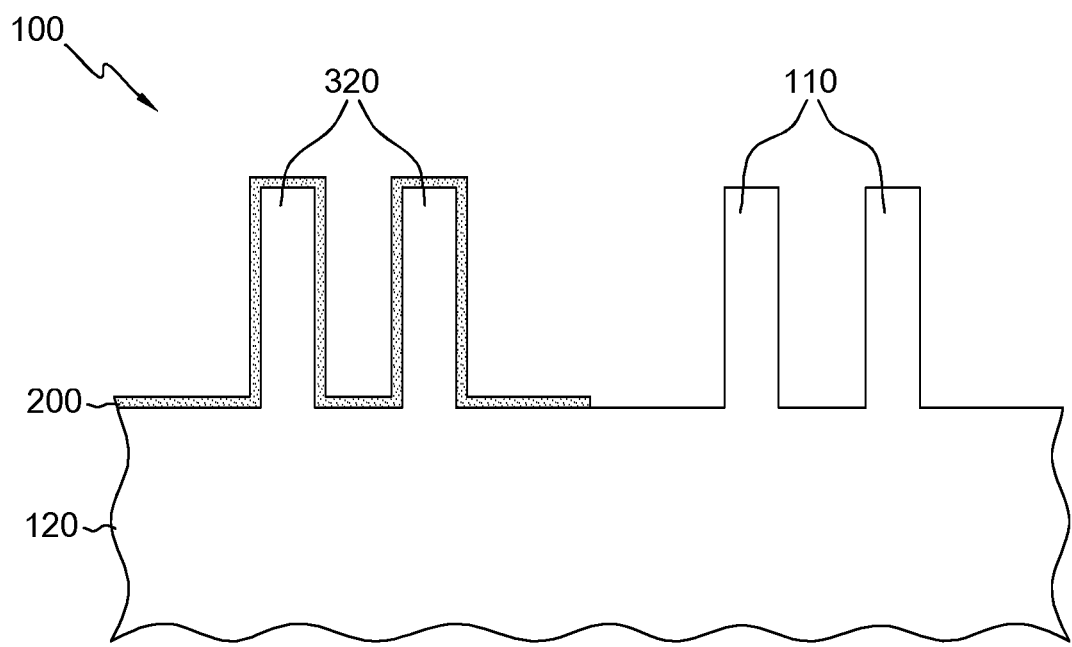
FIG. 4 depicts the partial semiconductor substrate of FIG. 3 after stripping after the photoresist layer has been stripped to expose a silicon dioxide layer.
Figure 5:
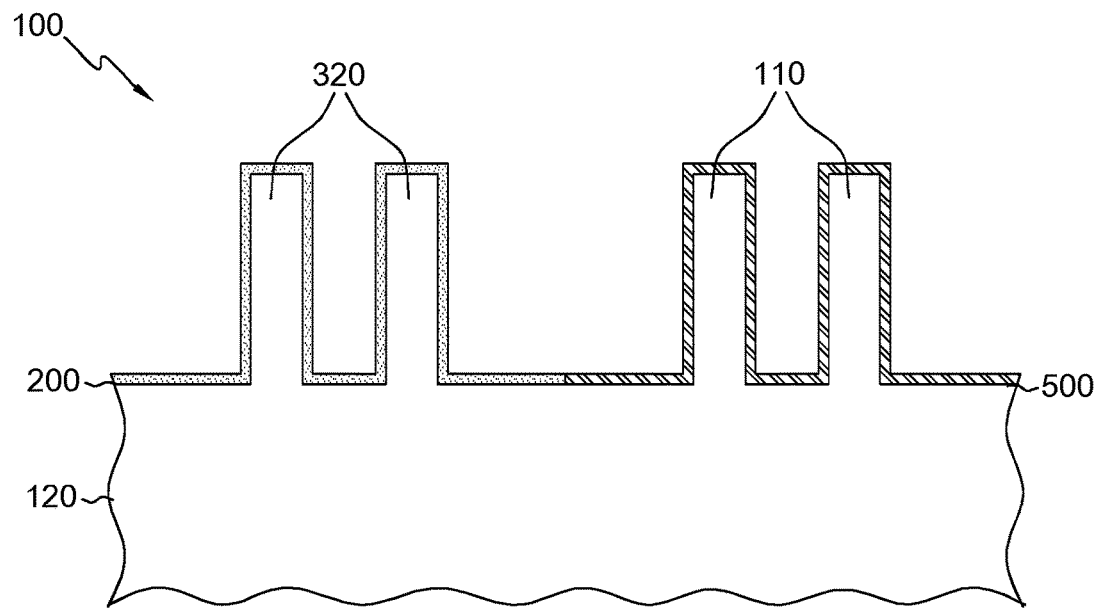
FIG. 5 depicts the partial semiconductor substrate of FIG. 4 after a pure boron layer has been selectively deposited over the substrate but not over the silicon dioxide layer.

After etching the PFET SSRW dopant-source layer 200, patterning resist layer 310 may be removed, resulting in the partial semiconductor structure 100 shown in FIG. 4. Subsequently, as shown in FIG. 5, a layer of pure boron 500 is conformally deposited over fins 100 and adjacent surface of semiconductor substrate 120. Specifically, a chemical vapor deposition process is used to deposit a thin layer selectively on surfaces lacking an exposed PFET SSRW dopant-source layer 200, such as a layer of silicon dioxide, or phosphosilicate glass. A thin layer of pure elemental boron 500, as thin as 1 nm, or thinner, may be deposited by conventional chemical deposition methods using an epitaxial chemical vapor deposition reactor, with diborane as the gas source and hydrogen gas as the carrier gas. Pure boron layer 500 will not deposit on PFET SSRW dopant-source layer 200, resulting in fins 320 and adjacent surfaces of semiconductor substrate 120 with a PFET SSRW dopant-source layer 200 deposited thereupon, and fins 110 and adjacent surfaces of semiconductor substrate 120 with an NFET SSRW dopant-source layer 500 deposited thereupon.

Figure 6:
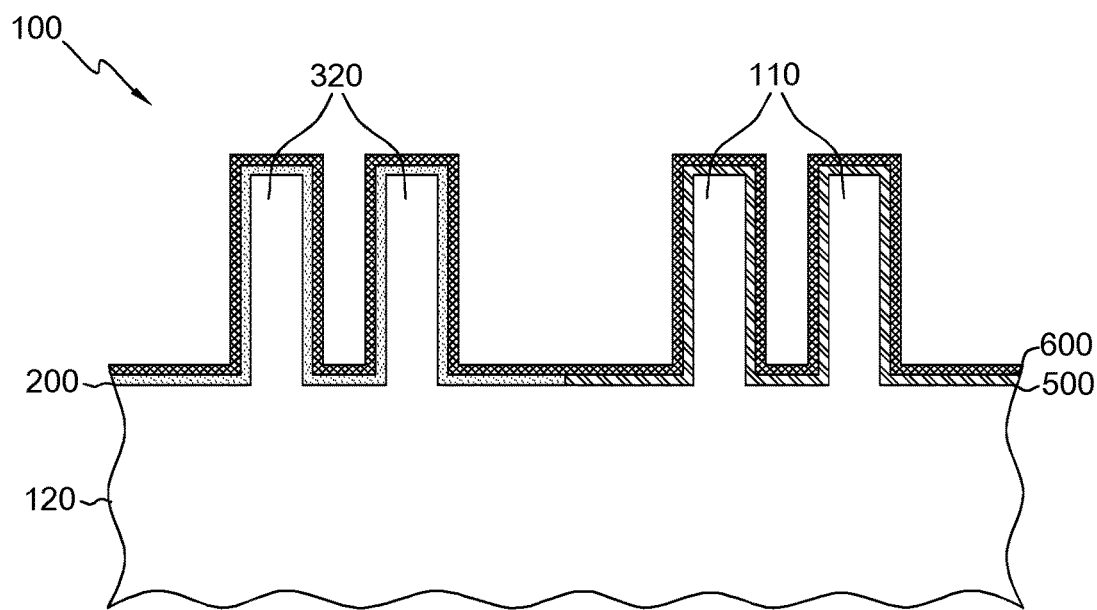
FIG. 6 depicts the partial semiconductor substrate of FIG. 5 after deposition of a silicon nitride liner layer.
Figure 7:
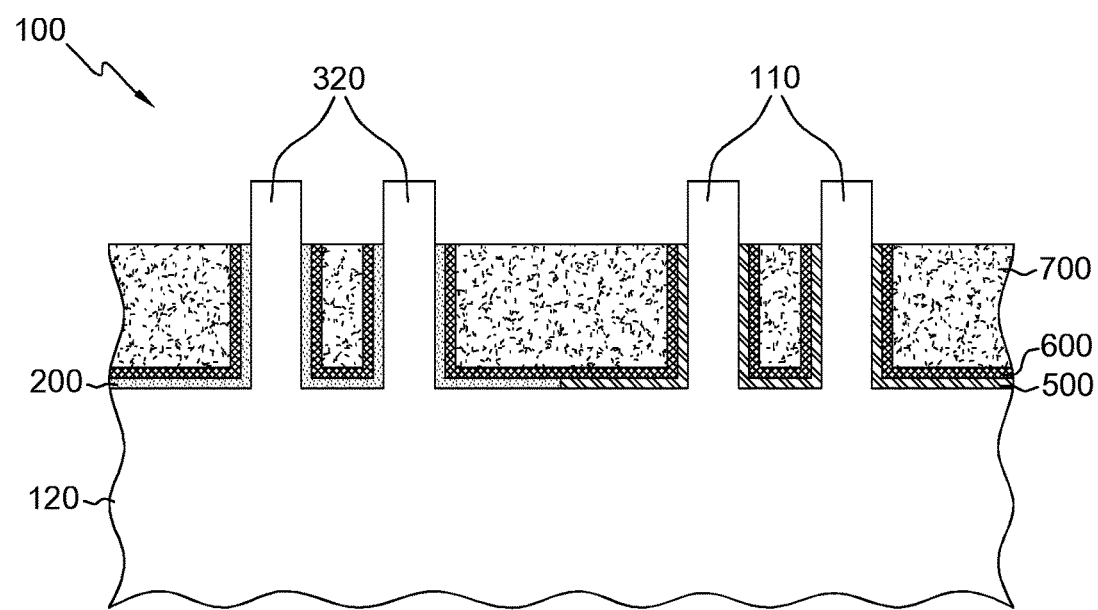
FIG. 7 depicts the partial semiconductor substrate of FIG. 6 deposition of an oxide layer followed by recessing the oxide layer to reveal the fins and etching the silicon nitride, boron, and silicon dioxide layers.

In FIG. 6, a silicon nitride cap layer has been conformally deposited over PFET SSRW dopant-source layer 200 and NFET SSRW dopant-source layer 500. Unlike conventional pre-anneal SSRW fabrication methods, only a single silicon nitride cap layer needs to be deposited in accordance with the present invention. FIG. 7 shows partial semiconductor device 100 several processing steps after that shown in FIG. 6, in accordance with some aspects of the present invention. In FIG. 7, a sacrificial oxide layer 700 has been deposited over fins 110 and 320 and semiconductor substrate 120 and was then etched back to reveal fins above sacrificial oxide layer 700. Silicon nitride cap layer 600, PFET SSRW dopant-source layer 200, and NFET SSRW dopant-source layer 500 may also be etched from the fin surfaces and sidewalls revealed above the recessed sacrificial oxide layer 700. A FET SSRW dopant-source layer 500 of pure boron may be removed by standard cleaning in HNO$_3$ (at 110° C.-65° C.) followed by a HF dip etch to remove the resultant oxide. SSRW may then be formed by a standard annealing step to drive dopants from PFET SSRW dopant-source layer 200, and NFET SSRW dopant-source layer 500 into silicon to form wells.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of making a semiconductor structure comprising:
   providing a plurality of fins on a semiconductor substrate;
   depositing a layer comprising silicon dioxide on the plurality of fins and on a surface of the semiconductor substrate;
   depositing a photoresist layer on one or more but less than all of the plurality of fins;
   etching the layer of silicon dioxide off of one or more of the plurality of fins on which the photoresist layer had not been deposited;
   stripping the photoresist layer;
   depositing a layer of pure boron on one or more of the plurality of fins on which a photoresist had not been deposited; and
   depositing a silicon nitride liner step on the plurality of fins.

2. The method of claim 1 wherein depositing a layer of pure boron comprises performing chemical-vapor deposition.

3. The method of claim 2 wherein performing chemical vapor deposition comprises using diborane as a gas source and hydrogen as a carrier gas.

4. The method of claim 2 wherein performing chemical vapor deposition comprises depositing pure boron at a temperature and the temperature is between 400° C. and 950° C.

5. The method of claim 1 wherein the silicon dioxide comprises phosphocilicate glass.

6. The method of claim 1 wherein a thickness of the layer of pure boron is less than 1 nm.

7. The method of claim 1 further comprising:
   depositing a layer of sacrificial oxide on the silicon nitride liner;
   recessing a portion of the layer of sacrificial oxide to expose a tip of the plurality of fins wherein the portion is less than all;
   removing the silicon nitride liner from the tip of the plurality of fins;
   removing a portion of the layer of phosphosilicate glass without removing a remainder of the layer of phosphosilicate glass and removing a portion of the layer of pure boron and without removing a remainder of the layer of pure boron, wherein the portion of the layer of phosphosilicate glass and the portion of the layer of pure boron are on the tip of the plurality of fins; and annealing the remainder of the layer of phosphosilicate glass and the remainder of the layer of pure boron to form a plurality of doped wells in the semiconductor substrate.

8. The method of claim 7 wherein the plurality of doped wells comprise super steep retrograde wells.

9. The method of claim 7 wherein removing a portion of the layer of pure boron comprises cleaning the tip of the plurality of fins with nitric acid and etching the tip of the plurality of fins with hydrofluoric acid.

10. The method of claim 7 wherein annealing the remainder of the layer of pure boron comprises heating the plurality of fins to a temperature for a period of time, wherein the temperature is between 700° C. and 1,100° C. and the period of time is between 1 ms and 200 min.

11. The method of claim 1 wherein a distance between two adjacent fins before depositing the layer of silicon dioxide thereupon is 18 nm or less.

12. A method of making a semiconductor structure comprising:
providing a plurality of fins on a semiconductor substrate;
depositing a layer of phosphosilicate glass on the plurality of fins and on a surface of the semiconductor substrate;
depositing a photoresist layer on one or more but less than all of the plurality of fins;
etching the phosphosilicate glass layer off of one or more of the plurality of fins on which the photoresist layer had not been deposited;
stripping the photoresist layer;
depositing a layer of pure boron on one or more of the plurality of fins on which a photoresist had not been deposited wherein depositing comprises performing chemical-vapor deposition using diborane as a gas source and hydrogen as a carrier gas at a temperature and the temperature is between 400° C. and 950° C.; and
depositing a silicon nitride liner step on the plurality of fins.

13. The method of claim 12 further comprising:
depositing a layer of sacrificial oxide on the silicon nitride liner;
recessing a portion of the layer of sacrificial oxide to expose a tip of the plurality of fins wherein the portion is less than all;
removing the silicon nitride liner from the tip of the plurality of fins;
removing a portion of the layer of phosphosilicate glass without removing a remainder of the layer of phosphosilicate glass and removing a portion of the layer of pure boron and without removing a remainder of the layer of pure boron, wherein the portion of the layer of phosphosilicate glass and the portion of the layer of pure boron are on the tip of the plurality of fins and wherein removing a portion of the layer of pure boron comprises cleaning the tip of the plurality of fins with nitric acid and etching the tip of the plurality of fins with hydrofluoric acid; and
annealing the remainder of the layer of phosphosilicate glass and the remainder of the layer of pure boron to form a plurality of doped wells in the semiconductor substrate comprising super steep retrograde wells.

* * * * *